United States Patent

Fukada et al.

Patent Number: 5,294,238
Date of Patent: Mar. 15, 1994

[54] GLASS SUBSTRATE FOR A SEMICONDUCTOR DEVICE AND METHOD FOR MAKING SAME

[75] Inventors: Takeshi Fukada; Naoya Sakamoto, both of Kanagawa, Japan

[73] Assignee: Semiconductor Energy Laboratory Co., Ltd., Kanagawa, Japan

[21] Appl. No.: 852,518

[22] Filed: Mar. 18, 1992

[30] Foreign Application Priority Data

Mar. 27, 1991 [JP] Japan .................. 3-087773
Feb. 5, 1992 [JP] Japan .................. 4-054321

[51] Int. Cl.$^5$ .................. C03C 17/34; C03B 25/00
[52] U.S. Cl. .................. 65/60.2; 65/60.5; 65/60.8; 65/95; 501/7
[58] Field of Search .................. 65/60.1, 60.5, 60.8, 65/95, 134, 33, 60.2; 501/7; 106/286.7

[56] References Cited

U.S. PATENT DOCUMENTS

| | | | |
|---|---|---|---|
| 3,537,868 | 11/1970 | Kosaka | 65/33 |
| 3,635,774 | 1/1972 | Ohta | 156/17 |
| 3,647,489 | 3/1972 | McMillan et al. | 65/33 |
| 3,760,242 | 9/1973 | Duffy et al. | 437/187 |
| 3,856,497 | 12/1974 | Hummel | 65/33 |
| 4,238,276 | 12/1980 | Kinugawa et al. | 156/634 |
| 4,413,061 | 11/1983 | Kumar et al. | 65/33 |
| 4,769,058 | 9/1988 | McMaster | 65/30.12 |
| 4,851,363 | 7/1989 | Troxell et al. | 437/40 |
| 4,992,393 | 2/1991 | Kosaka et al. | 437/83 |

Primary Examiner—W. Gary Jones
Assistant Examiner—Steven P. Griffin
Attorney, Agent, or Firm—Sixbey, Friedman, Leedom & Ferguson

[57] ABSTRACT

A glass substrate usable for a semiconductor device which shrinks less during a heating process. Specifically, lithium is added to the glass substrate material prior to formation. Further, the glass substrate can be thermal annealed in advance. In accordance with the present invention, it is possible to reduce substrate shrinkage even during TFT processing, by using glass material including more than 4% by weight of lithium, and further by heating the glass substrate at a temperature below the glass strain point temperature.

8 Claims, 1 Drawing Sheet

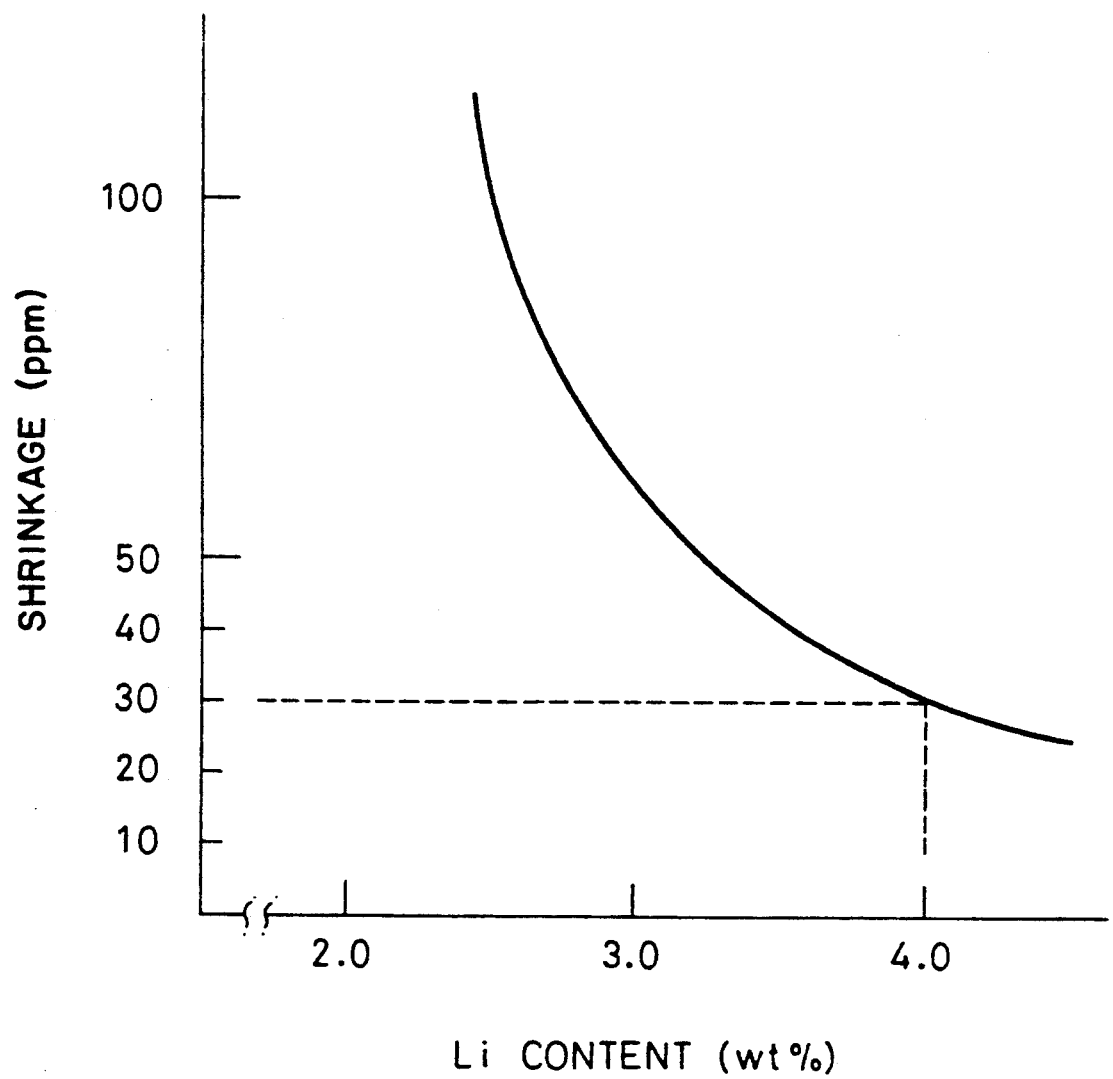

GLASS SUBSTRATE FOR A SEMICONDUCTOR DEVICE AND METHOD FOR MAKING SAME

BACKGROUND OF THE INVENTION

1. Field of the Invention

The present invention relates to a glass substrate and a method of making a glass substrate usable for a semiconductor device, which requires high temperature processing.

2. Description of the Prior Art

Up to the present, glass substrates for semiconductor devices have had almost zero value of thermal expansion coefficient at temperatures of 300°-600° C., which are necessary to make a semiconductor device. The crystallized glass is obtained by growing a crystal in the glass which has been previously heated to form a crystal nucleus. It is possible to make a glass which is resistant to thermal impact by controlling the crystallization to adjust the thermal expansion coefficient of the glass.

In general, glass will expand by heating. This results from the fact that glass has a positive coefficient of the thermal expansion. But, it is possible to make the thermal expansion coefficient at some temperatures approach zero without being plus or minus over the entire part of glass, by depositing crystallized constituents having negative coefficients of thermal expansion with the constituents of glass.

Products such as Liquid Crystal Display Devices and Image Sensors are produced by directly forming a semiconductor device, like a thin film transistor, on a glass substrate. However, to make such a semiconductor device, heating of more than 600° C. is required, which may cause glass to shrink. The glass shrinkage will shorten the glass substrate after glass is heated and then cooled. This phenomenon will occur repeatedly, even after a substrate is once shrunken. In fact, it will shrink more by a second thermal treatment. Namely, although it is generally known that glass will expand by heating, it has a hysteresis which causes glass to shrink compared with its original measure. The shrinkage ratio will be lowered in accordance with repeated thermal treatment.

The problem that the glass substrate will expand in the heating process can be solved by using the above-mentioned crystallized glass. For instance, as it is known that glass is controlled with the thermal expansion coefficient, heat resistant glass has been put into practical use.

On the other hand, the aforementioned problem of glass substrate shrinkage has caused difficulty using a mask combination in the making of a semiconductor device such as an Insulated Gate Field Effect Transistor (hereinafter to be referred to as TFT). That is, many sheets of photomask are used while processing a TFT. The masks in every process are different from each other in their pattern shapes, but they are designed to constitute the same TFT after all the processing is finished. As a matter of course, all the masks are prepared according to the same dimensional standards.

In the process of making the TFT using such masks, it is necessary to heat the substrate once at least. For that reason, the substrate will shrink before and after the heating process. As a result, some of patterns will not coincide with the substrate when the masks are made according to the same dimensional standard.

To overcome this problem of glass substrate shrinkage during the heating process, it has been proposed to shrink a glass substrate in advance by thermal treatment. This is useful in lightening the shrinkage of a substrate to some extent. The shrinkage of a glass substrate by heating is caused by the fact that an amorphous constituent existing in a glass substrate will be crystallized by heating. As a result, a volume of the substrate will be decreased. Accordingly, this proposed method is designed to remove the utmost of the constituents to be crystallized by heating, which is effected in an actual use of a glass substrate, by crystallizing in advance the amorphous constituents in glass.

However, it has not been practical to cause beforehand shrinkage of a glass substrate by heating in advance, as stated above, since it is not easy to stop complete shrinkage. Especially, in such case of an active Liquid Crystal Display Device having a big area or a contact type Image Sensor of the A4 or B4 size. In these cases, it is needed to fairly decrease the shrinkage of a glass substrate, since the required dimension of a substrate is very big. As a result, it has been impossible to attain a sufficiently effective method of one or two thermal treatments in advance.

Also, in the case where a semiconductor device includes a silicon semiconductor film with a crystalline character, an amorphous silicon on a glass substrate is crystallized by heating. In this case, a problem exists between the shrinkage difference of a silicon semiconductor film and a glass substrate, resulting in needless stress to the silicon film having a crystalline character which may cause cracking in the crystalline silicon.

SUMMARY OF THE INVENTION

Accordingly, it is an object of the present invention to solve the problem of needless shrinkage of a glass substrate during a heating process, and also to reduce the problem of stress to a crystalline silicon caused by shrinkage differences between a glass substrate and the silicon during a crystallizing process.

In accordance with the present invention, this can be achieved by adding more than 4% by weight of lithium to a molten glass material or further by thermal annealing the glass material including lithium at less than the maximum temperature up to which the glass substrate can be used. Thus, the shrinkage of the glass substrate can be lowered.

In addition, this can be achieved by a method of making a glass substrate usable for a semiconductor device which comprises forming a film of an amorphous silicon oxide on the glass substrate, followed by thermal annealing the glass substrate, on which the film of silicon oxide is formed at less than the maximum temperature up to which the glass substrate is used. Still further, the object can be achieved by forming a film of silicon nitride in a maximum thickness of 1000 Å, so as to prevent the lithium added to the glass substrate material from being diffused into the semiconductor film on the substrate.

In the present invention, a method of making a glass substrate to which more than 4% by weight of lithium is added can be accomplished by adding $Li_2CO_3$ to a glass material, when the glass substrate is made from a molten glass material. As a method of making a glass substrate, such conventional methods as the Roll Out, Down Draw, Fusion, and Float can be used. But the present invention is related to a method of making a glass substrate usable for a semiconductor device.

Therefore, the method itself of making a glass substrate is not limited at all.

The mixing of more than 4% by weight of lithium in a glass material is based on the fact that the shrinkage rate of a glass substrate in a heating process can be controlled by the amount of lithium. The thermal annealing of a glass substrate prepared from glass material including more than 4% by weight of lithium, at less than the maximum temperature in using range of the glass substrate, results because the crystallization to some degree of an amorphous constituent in the glass substrate by the thermal annealing prevents the glass substrate from shrinking, owing to the crystallization of the amorphous constituent in the subsequent heating process. Of course, the thermal annealing can be effected at more than the maximum temperature in the range usable for the glass substrate.

TFT is well known as a semiconductor device made on a glass substrate. In case where TFT is prepared using crystalline silicon, it is generally necessary to apply a high temperature more than 600° C. But it is not favorable to adopt the thermal treatment over the temperature of the glass strain point, since it brings about a glass transformation.

The thermal annealing of a glass substrate including more than 4% by weight of lithium and further having a silicon oxide film on it, at less than the maximum temperature in the range usable for the glass substrate, results from the finding that the above-noted shrinkage problem of the glass substrate in a heating process can be overcome, and further the stress occurring by shrinkage of a glass substrate at the crystallized silicon on the substrate can be lightened.

It is generally known that the direct formation of a semiconductor device on a glass substrate causes the glass substrate to exude such impurities as sodium, which has a bad influence on characteristics of a semiconductor. To prevent this exudation, it is proposed to form a so-called "Barrier Layer", by forming a silicon oxide film or a silicon nitride film in thickness of 1000–3000 Å on a glass substrate, as a base protective film. Also, experiments prove that the crystalline silicon obtained by thermal annealing the laminate member, which is composed so that a silicon oxide film is formed on a glass substrate as the base protective film, and then an amorphous silicon semiconductor layer is formed on the silicon oxide film, has a better performance in that the possibility of crack growth in the step of silicon crystallization is remarkably low, compared with the case where the amorphous silicon is directly formed on the glass substrate.

This is considered to result from the fact that the silicon oxide film lightens the stress generated between a glass substrate and a crystalline silicon layer. As a method of making the silicon oxide film, it is recommended to form a film in an atmosphere of 100% oxygen by using a magnetron type RF sputtering method. With respect to the Barrier Layer, the silicon nitride film is most excellent. However, between this silicon nitride film and the glass substrate including lithium, stress will occur and the silicon nitride film will be peeled off. As a result, a crack will grow, by thermal treatment. For that reason, it is preferable to keep the maximum thickness of a silicon nitride film in 1000 Å, especially less than 1000 Å, still especially less than 500 Å. Also as occasion demands, it is very effective to prepare a base protective layer which has a function to effect the barrier and to lighten the stress between a substrate and a semiconductor film by making a plural lamination of this silicon nitride and a silicon oxide film.

It is resulted from the above-stated reason that the silicon oxide film is formed on the glass substrate including more than 4% by weight of lithium, and then it is treated by thermal treatment in the present invention. There is also the other method to form a silicon oxide film on a glass substrate which has previously been thermal annealed. It is preferable to also effect the beforehand thermal annealing of the silicon oxide film formed on a glass substrate as a base protective film, so as to make the base protective film have a stress lightening function.

BRIEF DESCRIPTION OF THE DRAWING

The objects, features, and advantages of the present invention will become more apparent from the following description of the preferred embodiments taken in conjunction with the accompanying drawing, in which:

FIG. 1 is a graph showing the relationship between the added amounts of lithium to the glass material vs. the shrinkage of the glass substrate, after the glass substrate prepared from a glass material including lithium was heated at 600° C. and then cooled.

DETAILED DESCRIPTION OF THE PREFERRED EMBODIMENTS

The present invention will be described below in further detail in the following Examples. The present invention is by no means limited to these Examples.

EXAMPLE 1

In this Example of the present invention, the result of adding more than 4% by weight of lithium to the glass material composing the glass substrate will be explained.

FIG. 1 shows the relationship between the amounts of lithium % by weight in the glass material and the shrinkage of the glass substrate after heating at 600° C. It is evident from the graph that the shrinkage of the glass substrate becomes less than 30 ppm in case where the lithium content in the glass material is over 4% by weight. The 30 ppm shrinkage of the substrate in $10 \times 10$ cm corresponds to 3 $\mu$m shrinkage in length. Considering that the channel length of TFT used for Liquid Crystal Display Device or Image Sensor is about 5 $\mu$m, this value can be regarded as a minimum level for practical use.

EXAMPLE 2

In this Example of the present invention, the glass substrate controlled shrinkage to 21 ppm by adding 5% by weight of lithium. $SiH_4$ gas and $N_2$ gas were reacted to produce silicon nitride by heating at about 400° C. and then, the silicon nitride film having a thickness of 500 Å was formed on the glass substrate by LPCVD (Low Pressured Chemical Vapor Deposition) method. In the step of forming the silicon nitride film, the simultaneous heating of the substrate enabled the shrinkage to be further lowered.

On the silicon nitride film, silicon oxide film was further formed in thickness of 2500 Å by a conventional sputtering method. After that, the substrate was heated again at about 450° C. to cause the films of silicon nitride and silicon oxide on the substrate to be the base layer to function as both barrier and stress-lightening. The glass substrate usable for a semiconductor device was thereby obtained.

As explained above, in accordance with the present invention, by making a glass substrate using a glass material including more than 4% by weight of lithium, and then by thermal annealing the silicon oxide film formed on the glass substrate, it is possible to reduce shrinkage of the glass substrate in the heating process for preparing a semiconductor device on the glass substrate, and also to lighten the stress acting on the semiconductor when it is thermal crystallized.

What is claimed is:

1. A method of making a glass substrate for a semiconductor device, said method comprising:
    adding more than 4% by weight of lithium to a molten glass material to form a lithium containing glass material;
    forming a glass substrate from said lithium containing glass material;
    thermal annealing said glass substrate in order to shrink said glass substrate prior to preparing said semiconductor device on said glass substrate; and
    preparing said semiconductor device on said glass substrate.

2. A method of making a glass substrate for a semiconductor device according to claim 1, wherein said thermal annealing said glass substrate is at a temperature below a glass strain point of said glass substrate prior to preparing said semiconductor device.

3. A method of making a glass substrate for a semiconductor device according to claim 2, wherein a silicon oxide film is formed on the glass substrate before said thermal annealing step.

4. A method of making a glass substrate for a semiconductor device, said method comprising:
    adding more than 4% by weight of lithium to a molten glass material to form a lithium containing glass material;
    forming a glass substrate from said lithium containing glass material;
    forming a silicon nitride film having a blocking action to lithium diffusion on the glass substrate;
    forming a silicon oxide film on said silicon nitride film; and
    thermal annealing said glass substrate which includes said silicon nitride film and said silicon oxide film at at temperature below a glass strain point of said glass substrate.

5. A method of making a glass substrate for a semiconductor device according to claim 4, wherein said silicon nitride film is less than 1000 Å.

6. A method of making a glass substrate for a semiconductor device, said method comprising:
    adding more than 4% by weight of lithium to a molten glass material to form a lithium containing glass material;
    forming a glass substrate from said lithium containing glass material;
    forming a silicon nitride film, which has a blocking action to lithium diffusion, on said glass substrate;
    forming a silicon oxide film on said silicon nitride film; and
    thermal annealing said glass substrate which includes said silicon nitride film and said silicon oxide film.

7. A method of making a glass substrate for semiconductor device according to claim 6, wherein said silicon nitride film is less than 1000 Å.

8. A method of making a glass substrate for a semiconductor device comprising the step of:
    thermal annealing a glass substrate containing more than 4% by weight of lithium at a temperature less than a glass strain point of said glass substrate; and
    preparing said semiconductor device on said glass substrate.

* * * * *